(12) United States Patent
Kelly et al.

(10) Patent No.: US 10,673,416 B2
(45) Date of Patent: Jun. 2, 2020

(54) SUPPRESSION OF ELECTROMAGNETIC INTERFERENCE IN SENSOR SIGNALS

(71) Applicant: Analog Devices, Inc., Norwood, MA (US)

(72) Inventors: Thomas W. Kelly, North Andover, MA (US); Ekin Yagmur Gonen, Woburn, MA (US)

(73) Assignee: Analog Devices, Inc., Norwood, MA (US)

( * ) Notice: Subject to any disclaimer, the term of this patent is extended or adjusted under 35 U.S.C. 154(b) by 405 days.

(21) Appl. No.: 15/230,599

(22) Filed: Aug. 8, 2016

(65) Prior Publication Data

US 2018/0041198 A1    Feb. 8, 2018

(51) Int. Cl.
*H03K 3/013* (2006.01)
*H03K 3/84* (2006.01)

(52) U.S. Cl.
CPC .............. *H03K 3/013* (2013.01); *H03K 3/84* (2013.01)

(58) Field of Classification Search
None
See application file for complete search history.

(56) References Cited

U.S. PATENT DOCUMENTS

| 2,292,387 | A | 8/1942 | Kiesler et al. |
| 5,115,202 | A | 5/1992 | Brown |
| 7,177,132 | B2 | 2/2007 | Gasperi et al. |
| 8,344,928 | B2 | 1/2013 | Guedon et al. |
| 8,854,057 | B2 | 10/2014 | Balachandran et al. |
| 8,860,440 | B2 | 10/2014 | Balachandran et al. |
| 2005/0218911 | A1 | 10/2005 | Denison |
| 2006/0158244 | A1 | 7/2006 | Kejariwal et al. |
| 2007/0216477 | A1 | 9/2007 | McConnell |
| 2007/0247171 | A1 | 10/2007 | O'Dowd et al. |
| 2013/0015798 | A1* | 1/2013 | Wright ............... H03K 7/08 318/400.25 |
| 2015/0077141 | A1* | 3/2015 | Russ ............... H03K 17/955 324/676 |
| 2015/0226556 | A1* | 8/2015 | Aaltonen ........... G01C 19/5712 73/504.12 |
| 2016/0305838 | A1* | 10/2016 | Wiesbauer ........... G01L 9/0072 |

FOREIGN PATENT DOCUMENTS

CN    102780459 A    11/2012

\* cited by examiner

*Primary Examiner* — Douglas X Rodriguez

(74) *Attorney, Agent, or Firm* — Wolf, Greenfield & Sacks, P.C.

(57) ABSTRACT

Circuits and techniques are described for reducing the impact of environmental noise and interference on the output signal of a capacitive sensor. The output signal is sampled randomly in some situations by generating a random sampling instant within a fixed clock period. The sampling is performed by a sampling or demodulation circuit. The demodulation circuit may be part of a larger circuit with various components that operate based on a fixed period clock signal.

20 Claims, 11 Drawing Sheets

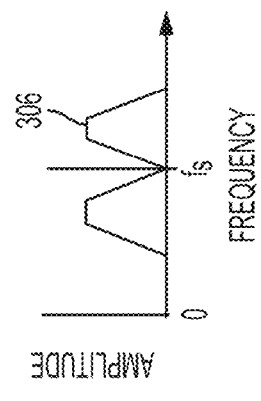
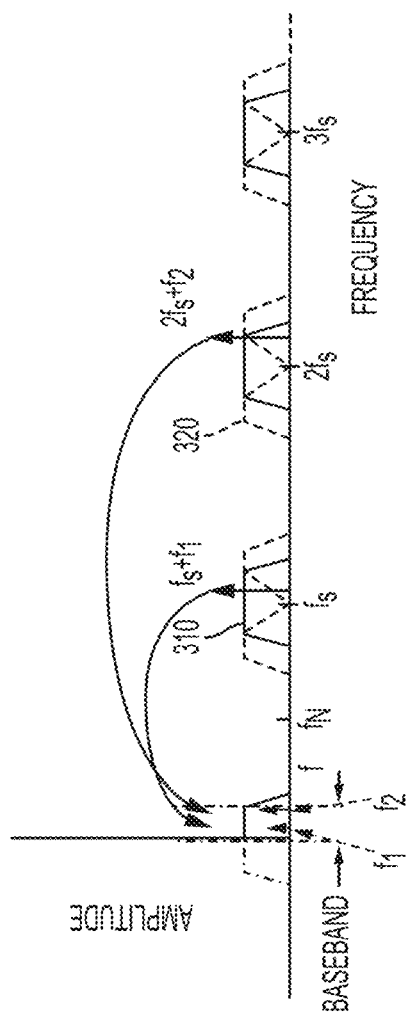
FIG. 3A
FIG. 3B
FIG. 3C
FIG. 3D

US 10,673,416 B2

SUPPRESSION OF ELECTROMAGNETIC INTERFERENCE IN SENSOR SIGNALS

FIELD OF THE DISCLOSURE

The present application relates to suppression of electromagnetic interference in sensor signals.

BACKGROUND

Capacitive sensors are used to sense various environmental conditions. Such sensors sometimes are driven by a drive signal, and output an electrical signal representing the sensed condition. The electrical signal is sometimes sampled at a desired timing. Electrical noise is sometimes present in the electrical signal output of the sensor as a result of electromagnetic interference.

THE SUMMARY OF THE DISCLOSURE

Circuits and techniques are described for reducing the impact of environmental noise and interference on the output signal of a capacitive sensor. The output signal is sampled randomly in some situations by generating a random sampling instant within a fixed clock period. The sampling is performed by a sampling or demodulation circuit. The demodulation circuit may be part of a larger circuit with various components that operate based on a fixed period clock signal.

In certain embodiments, an apparatus is provided, comprising a capacitive sensor, a sampling circuit coupled to an output of the capacitive sensor, and a clock edge randomization circuit. In some embodiments, the clock edge randomization circuit is coupled to an input of the sampling circuit and configured to provide to the sampling circuit a sampling signal with a fixed clock period and a randomly varying duty cycle.

In certain embodiments, an apparatus is provided, comprising a capacitive sensor, and means for sampling an output signal of the capacitive sensor at random times.

In certain embodiments, a method is provided, comprising generating a sensor output signal from a capacitive sensor, generating a sampling signal with a fixed clock period and a randomly varying duty cycle, and sampling the sensor output signal with the sampling signal.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIGS. 3A, 3B, and 3C illustrate alternative probability distributions which may be used in generating a randomized sampling signal, according to an aspect of the present application.

FIG. 3D illustrates the impact of a shaped probability distribution of a randomized sampling signal on an interference signal.

DETAILED DESCRIPTION

Sensors that operate by detecting a change in electrical capacitance typically output to a processing circuit an electrical signal reflecting the sensed condition, such as acceleration, velocity, pressure, or other condition. The electrical signal typically includes undesirable electrical noise, the magnitude and spectral content of which can be influenced by environmental factors, such as electromagnetic interference signals in the vicinity of the sensor. The electrical noise represents inaccuracy in the sensor output signal since it does not result from the sensed condition.

Aspects of the present application provide a processing circuit for processing the signal output by a capacitive sensor that samples the sensor output signal at random times. The processing circuit may be referred to in some embodiments as a sampling circuit or a demodulation circuit, since it may demodulate the sensor output signal. In some embodiments, the random sampling signal used to sample the sensor output signal may be obtained by randomizing a periodic clock signal used throughout the sensor system. This may be done in a manner such that portions of the sensor system other than the sampling circuit which samples the sensor output signal may receive the periodic clock signal, instead of the randomized version of the clock signal. Thus, in some embodiments, the demodulation circuit coupled to a capacitive sensor to receive and demodulate the sensor output signal may operate based on a randomized clock signal, even though a corresponding modulation circuit used to provide a modulated signal to the capacitive sensor may not. Moreover, the use of a signal chopper as part of the processing circuit may be avoided in at least some embodiments. Thus, a reduction in electromagnetic interference-induced noise in the sensor output signal may be achieved, with a simple and cost-effective circuit design.

Figure 1:
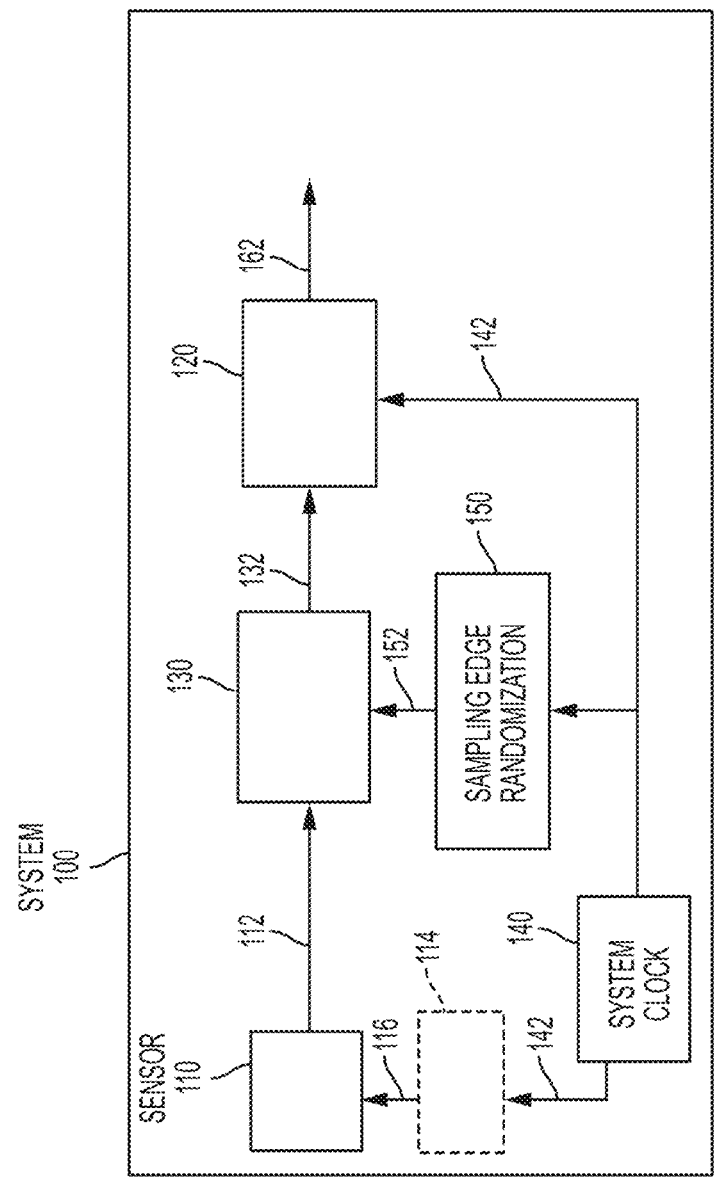
FIG. 1 is a block diagram of a system including a sensor and a sampling circuit configured to randomly sample an output signal of the sensor, according to a non-limiting embodiment of the present application.

FIG. 1 is a block diagram of an exemplary system 100 configured to randomly sample a sensor output signal, according to an aspect of the present application. The system 100 comprises a sensor 110 producing a sensor output signal 112, a first circuit block 120 producing a system output signal 162, a second circuit block 130, a system clock 140 producing a system clock signal 142, and a sampling edge randomization block 150 producing a random sampling signal 152. Optionally, the system 100 may include a modulation circuit 114, shown in dashed lines.

The sensor 110 may be a capacitive sensor. For example, the sensor 110 may be a microelectromechanical systems (MEMS) capacitive accelerometer, sensing the acceleration of an object to which the sensor is fixed, such as a car. Alternatively, the sensor 110 may be a capacitive pressure sensor. While accelerometers and pressure sensors represent two examples of suitable sensors 110, the type of sensor 110 is not limiting of the various aspects described herein. Moreover, capacitive sensors are a non-limiting example, as piezoresistive, optical, or other sensor types may be used.

First circuit block 120 may be an integrated circuit with suitable componentry to perform amplification, filtering, buffering, encoding, or other data processing. The first circuit block 120 may also output the system output signal 162 in the form of data representing the detected sensor signal. The system output signal 162 may be provided to an external system, not shown, such as an external computer, mobile processor, or other device. The external system may optionally perform further processing of the sensor signal, image generation, image display, or other functions. The system output signal 162 may be provided to the external system via a wired connection, such as a twisted pair lead, or a wireless connection. An example is described below in connection with FIG. 5, which shows a system embedded in an automobile.

The second circuit block 130 may be a sampling circuit or demodulation circuit suitable for demodulating the sensor output signal 112. In some embodiments, the second circuit block 130 includes a plurality of switches, examples being shown in FIGS. 2A and 4A and described further below. As will be described further in connection with those figures, the second circuit block 130, and the system 100 more generally, may lack a chopper circuit.

The system clock 140 may be any suitable type of system clock. In some embodiments, the system clock may be an oscillator comprising a quartz resonator. In alternative embodiments, the system clock may include a MEMS resonator. The type of system clock 140 is not limiting of the various aspects described herein.

The sampling edge randomization block 150 may be any suitable circuit for randomizing the system clock signal 142 produced by system clock 140. A non-limiting example is described below in connection with FIG. 2C.

Figure 2A:
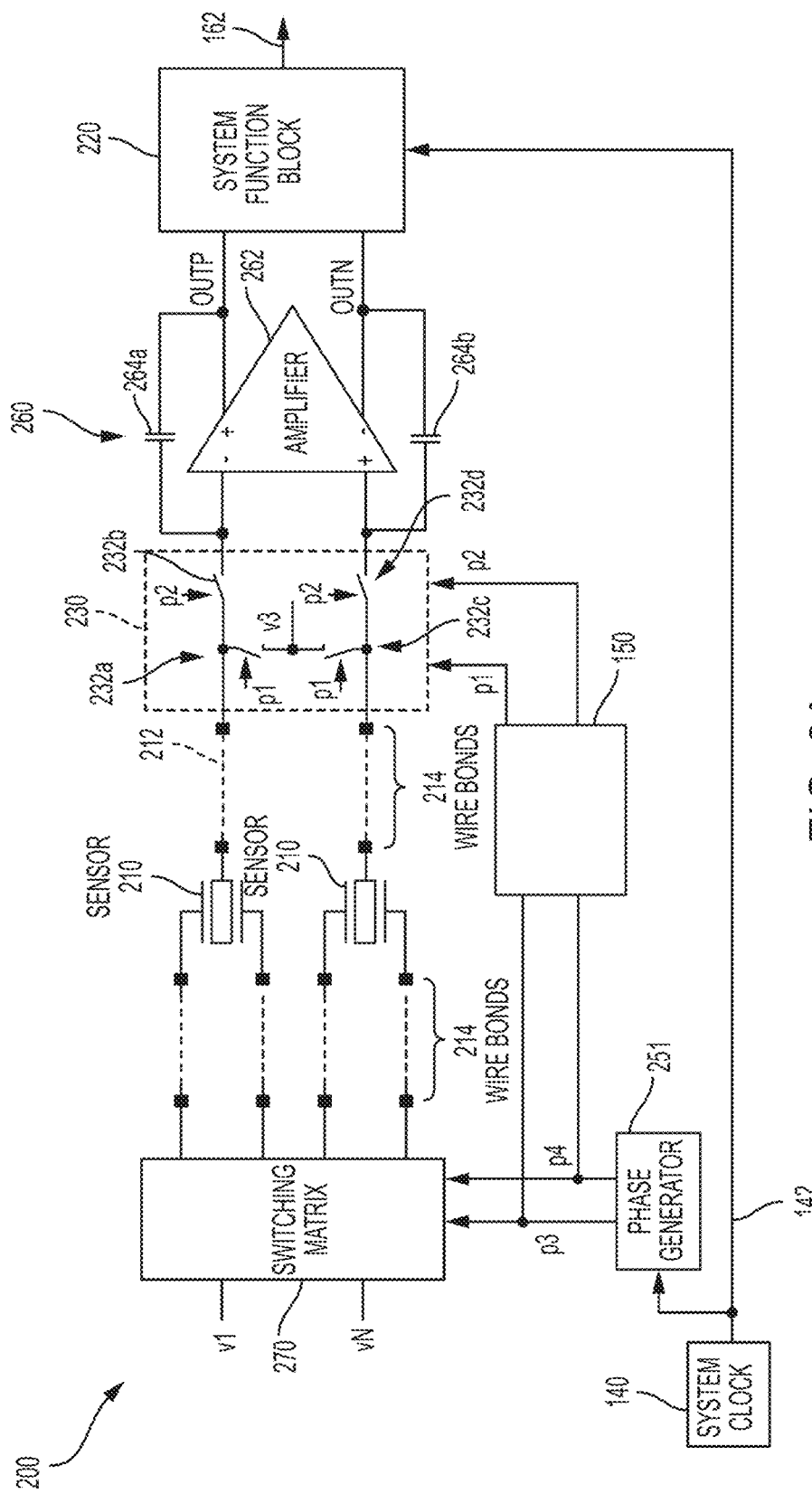
FIG. 2A is detailed example of a system of the type of FIG. 1.

As described, the modulation circuit 114 is optional, as certain types of sensors which may serve as sensor 110 may not receive drive signals or other input signals that are modulated. In those embodiments in which modulation circuit 114 is included, it may take any suitable form, a non-limiting example of which is shown in FIG. 2A and described below.

In operation, the sensor 110 may sense a condition of interest, such as acceleration, pressure, or other condition. Optionally, depending on the type of sensor 110, it may be driven during operation. In such situations, the modulation circuit 114 may provide a modulated input signal 116 to the sensor 110. The modulation circuit 114 itself may receive the system clock signal 142 generated by the system clock 140.

The sensor 110 may output the sensor output signal 112 indicative of the sensed condition. The sensor output signal 112 may be provided continuously, periodically, or at any other suitable timing. The sensor output signal 112 may be provided to the second circuit block 130, which may sample it, or demodulate it and provide a demodulated sensor output signal 132 to the first circuit block 120. As previously described, the first circuit block 120 may perform amplification, filtering, data buffering, encoding, or other processing functions to generate the system output signal 162 which is output from the system 100.

Applicant has appreciated that environmental electrical noise present in the sensor output signal 112 may be reduced by sampling the sensor output signal 112 with the second circuit block 130 at random times, but that there are also benefits to controlling the other components of system 100 with a non-randomized clock signal. Sampling the sensor output signal 112 at random times may reduce the impact of environmental noise because the environmental noise may be characterized by a frequency different than the frequency of the sensor output signal 112. For example, the frequency of the sensed condition may be relatively lower than the frequency of the environmental noise, such as electromagnetic interference. In some applications, such as for automotive sensors, the sensor signal baseband frequency is lower, and in some situations much lower, than the prevalent electromagnetic interference frequency bands and it is desired to reduce picking up such high frequency interference that overlaps with the multiple harmonic frequencies of a single demodulation clock. By sampling the sensor output signal 112 at random times, the contributions to that signal from the sensed condition and the environmental noise may largely be differentiated.

Thus, an embodiment of the current application employs a randomized demodulation technique to spread the frequency content of the interference noise signals across and/or outside of the sensor baseband signal bandwidth, reducing the level of interference and noise contribution within the measured sensor baseband signal. As a result, a more accurate determination of the sensed condition may be made. In the example of system 100, a sample edge randomization circuit 150 is provided to modify the system clock 140 to provide a randomized sample timing to spread the frequency content of interference signals across a wide frequency range, thereby reducing the level of interference or noise contributions within the baseband and improving system performance.

However, as described above, Applicant has also appreciated that sensors like sensor 110 may be used in systems including additional components clocked by a clock signal, such as system 100. While randomizing the sampling incident of the sensor output signal may beneficially reduce the impact of environmental noise on the sensor output signal 110, randomizing the clock signals used to clock the other components of system 100 may complicate design and operation of the system 100 and/or negatively impact performance of the system 100. For example, the first circuit block 120 and the optional modulation circuit 114 may also receive clock signals to control their operation. It may be beneficial to synchronize operation of the first circuit block 120 with operation of an external component to which system 100 is connected, such as an external computer (e.g., an automobile mainframe). Use of a single centralized clock such as system clock 140 may facilitate synchronization of the timing between signal processing and transmission in multiple components. Also, providing modulation circuit 114 with a periodic clock signal, such as system clock signal 142, may simplify circuit design by obviating the inclusion of components to provide synchronization between random modulation and demodulation activities. Moreover, system 100 may include components in addition to those shown, which may also operate based on a clock signal, and thus the operation of which may be simplified by provision of a periodic clock signal rather than a randomized signal.

Accordingly, system 100 is configured to randomize the sampling incident of the sensor output signal 112 without randomizing the system clock signal 142 provided to first circuit block 130 and modulation circuit 114. As shown, the randomization is provided by sampling edge randomization block 150 configured to receive the system clock signal 142 and produce the random sampling signal 152. In this embodiment, the sampling edge randomization block 150 does not impact the system clock signal 142 provided to first circuit block 120, modulation circuit 114, or other components of the system receiving the system clock signal 142.

In some embodiments, the system 100 may include feedback. For example, the demodulated sensor output signal 132 or the system output signal 162 may be provided to sensor 110 as an input signal. However, various aspects described herein are not limited to systems implementing such feedback.

FIG. 2A is a schematic diagram of an exemplary sensor modulation and demodulation system 200 according to an aspect of the present application, and is an example of the system of FIG. 1. Some of the components are the same and thus the same reference numbers are used. The system 200 includes a capacitive sensor 210, system clock 140, phase generator 251, switching matrix 270, sampling edge randomization block 150, demodulation circuit 230, integrator 260, and system function block 220. Wire bonds 214 couple the switching matrix 270 and the demodulation circuit 230 to the sensor 210, since the sensor 210 may be on a separate chip than the switching matrix 270 and demodulation circuit 230.

Sensor 210 may represent an implementation of sensor 110 of FIG. 1, and may be any suitable type of sensors. For example, sensor 210 may be linear accelerometer configured to detect acceleration of an object. For instance, the system 200 may be employed in a car or other automobile, and the sensor 210 may sense linear acceleration of the car. Sensor 210 is shown as including two capacitors, since in this non-limiting embodiment it may be a differential sensor. For example, sensor 210 may be a differential linear accelerometer. Thus, sensor output signal 212 may be a differential signal. However, not all embodiments are limited to use of a differential sensor, as sensors producing single-ended output signals may alternatively be employed in some embodiments.

The phase generator 251 may be any suitable circuit for generating signals of different phases from system clock signal 142. In the illustrated embodiment, four signals are derived from system clock signal 142. Phase generator 251 generates two differently-phased signals, which are provided to switching matrix 270 and also to sampling edge randomization block 150, which generates signals p1 and p2. The signals generated by phase generator 251 and provided to the switching matrix 270 are termed p3 and p4. In some embodiments, p1 and p2 may be substantially 180 degrees out-of-phase with each other, as may be signals p3 and p4. Signals p1 and p2 may also have different phases than signals p3 and p4, owing to the randomization of p1 and p2, but not all embodiments are limited in this respect.

The demodulation circuit 230 includes a plurality of switches configured to perform demodulation of the sensor output signal 212. In this non-limiting example, four switches are included, 232a, 232b, 232c, and 232d. Their operation is described further below. It should be appreciated that the demodulation circuit 230, and the system 200 more generally, lacks a chopper circuit. The design and implementation of system 200 may be simpler and less costly than a system involving a chopper circuit.

The integrator 260 may be any suitable type of integrator for integrating signals provided by a capacitive sensor, such as capacitive sensor 210. In the illustrated embodiment, the integrator 260 includes an amplifier 262 and feedback capacitors 264a and 264b. The integrator may output a differential signal including a positive component outp and a negative component outn.

The system function block 220 may be an implementation of first circuit block 120 of FIG. 1. For example, the system function block 220 may perform filtering, buffering, encoding or other functions to generate the system output signal 162.

The switching matrix 270 may include a plurality of switches suitable to switchably apply voltage signals V1 . . . VN to the sensor 210. In some embodiments, the signals V1 . . . VN are fixed voltages. In some embodiments, the signals V1 . . . VN are feedback signals, for example of the types described above in connection with the optional feedback of FIG. 1.

In operation, the system clock 140 generates the system clock signal 142, which is provided to the phase generator 251. The phase generator 251 generates the two out-of-phase signals, p3 and p4, and provides them to the switching matrix 270. The signals p3 and p4 may be substantially 180 degrees out-of-phase with each other in some embodiments and, as described further below in connection with FIG. 2B, the timing of signals p3 and p4 may be selected to synchronize operation of the switching matrix 270 with the demodulation circuit 230. The switching matrix 270 may apply signals V1 and V2 to the capacitive sensor 210. For example, the signals V1 and V2 may be applied to fixed plate terminals of the capacitive sensor 210.

The sensor output signal 212 may be provided to the demodulation circuit 230 via wire bonds 214. The wire bonds may be subject to environmental interference, such as electromagnetic interference from onboard or offboard electronics in an automobile. Likewise, the sensor 210 may be connected to the switching matrix 270 via wire bonds 214 that are subject to electromagnetic interference. The operation of the demodulation circuit 230 may reduce the impact of such environmental interference in the baseband of the sensor signal. The demodulation circuit 230 may operate to randomly sample the sensor output signal 212 based on signals p1 and p2. An example of such operation is described in connection with FIG. 2B.

Figure 2B:
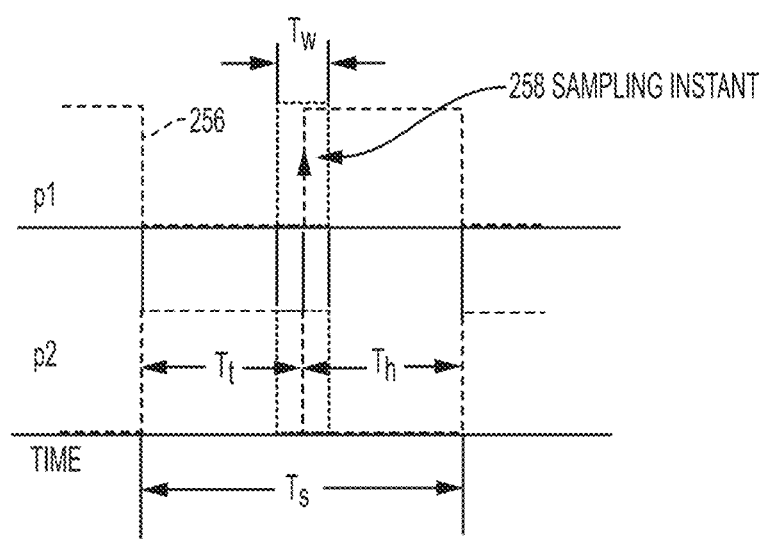
FIG. 2B is a timing diagram illustrating the timing of clock signals used to randomly sample the output signal of a sensor, as may be used in the system of FIG. 2A.

Generally, the switches 232a-232d are operated to alternately connect the sensor output signal 212 to the amplifier 262 and to a common node for resetting the stored charge on the sensor 210. Signal v3 may be a reset signal. FIG. 2B is a schematic timing diagram illustrating the timing of signals p1 and p2 as may be generated by sampling edge randomization block 150 and applied to control switches 232a-232d of the demodulation circuit 230.

In this embodiment, the switches 232a-232d are ON (e.g., closed) when the respective control signal p1 or p2 is at a high level, although the opposite operation is possible. Signal p1 controls switches 232a and 232c to turn OFF (e.g., open) at a falling edge 256 when the high signal level falls to a low level. At the same time, signal p2, which is configured to be 180 degrees out of phase with signal p1, turns ON switches 232b and 232d by undergoing a rising edge. Turning OFF switches 232a and 232c and turning ON switches 232b and 233d initiates a charge transfer from the capacitive sensor 210 to the integrator 260. This amounts to a track/sample state with a track time, or duration, $T_t$. When switches 232a and 232c turn ON and switches 232b and 232d turn OFF at a rising edge 258 of signal p1 and a falling edge of signal p2, the stored charge of sensor 210 is reset and the outputs outp and outn of integrator 260 are in a hold state for a hold time, or duration, $T_h$.

Environmental interference, such as electromagnetic interference, is typically continuous, taking the form of continuous time signals mixed in with the sensor output signal 212. Thus, as part of the sensor output signal 212, it is sampled on the falling edge of signal p2, which in the example of FIG. 2B corresponds to a rising edge of signal p1. This time is termed herein the "sampling instant." After the sampling instant, the integrator 260 holds the sampled signal during the hold time $T_h$. The beginning of the hold time may be considered a demodulation instant for the sensor output signal 212. Charge transfer from the sensor 210 to the integrator 260 is done during the track time $T_t$. The beginning of the track time can be considered a modulation instant.

According to some embodiments, the sampling instant represented by the rising edge 258 of p1 and falling edge of p2 may be randomized in time, such as an instant randomly chosen within a time window $T_W$ so that the hold time and the track time are varied by a same amount with opposite signs. Since environmental interference is sampled at random times at the sampling instant and the integrator holds the sensor output signal and the randomly sampled interference signal, the system may effectively suppress the relatively high frequency interference signals.

In some embodiments, the total period $T_s=T_t+T_h$ of the signals p1 and p2 as shown in FIG. 2B may be set as a fixed value that matches the period of system clock signal 142. Thus, the modulation of the sensor 210 performed by switching matrix 270 may be, and in at least some embodiments is, synchronized with the rest of the system 200. Randomizing the sampling instant without randomizing the modulation timing simplifies the system sampling and timing because the period of a system function block's clock is not altered. Therefore, the single system clock signal 142 may be used to coordinate the timing of various components of the system 200 with separate external components.

The techniques disclosed in the example above can be applied within a system function block within a larger system without affecting the timing of the larger system or introducing a need for separate timing clocks. With a fixed total time period $T_s$ as shown in the example in FIG. 2B, the signals p1 and p2 are effectively square waves with a fixed period but with a randomized duty cycle. Phase generator 251 and sampling edge randomization block 150 may be chosen from any suitable circuits that are configured to modify a fixed period system clock signal into a square wave with a randomized duty cycle.

As previously described, the system 200 also may include a system function block 220. Because the system function block 220 may operate based on the system clock signal 142, it may be readily synchronized with other components of the system 200 as well as components external to the system 200, even though the sampling instant executed by the upstream demodulation circuit 230 may be randomized.

Randomizing the demodulation of a sensor output signal by providing a randomized sampling instant as shown in FIG. 2B has the general effect that an interference signal of a frequency that is fixed or uncorrelated with the randomized sampling frequency will appear in the baseband of the system as random noise. This is preferable to interference signals appearing as a stable (DC or AC) signal in the baseband of the system, since the noise may then be more readily differentiated from the desired sensor signal.

A number of methods may be employed to create randomized clock timing. Relevant parameters to be considered include the frequency bandwidth of the randomized clock modulation, and the probability distribution of the randomized clock. In some embodiments, the frequency bandwidth of the randomization function may be limited, for example to a known bandwidth. For example, according to one embodiment the frequency bandwidth of the randomized clock signal (e.g., the sampling signal produced by clock edge randomization block 150) may be chosen to spread the aliased interference signal over the baseband bandwidth of the sensor signal. It should be appreciated that the frequency bandwidth of the randomization function and probability distribution of the randomized clock are related to the power spectral density of the randomized clock signal. In another embodiment, the power spectral density of the randomized clock signal may be chosen so that the power spectral density of the aliased interference signal is mostly outside the baseband of the sensor signal or away from the center of the baseband of the sensor signal.

Figure 2C:
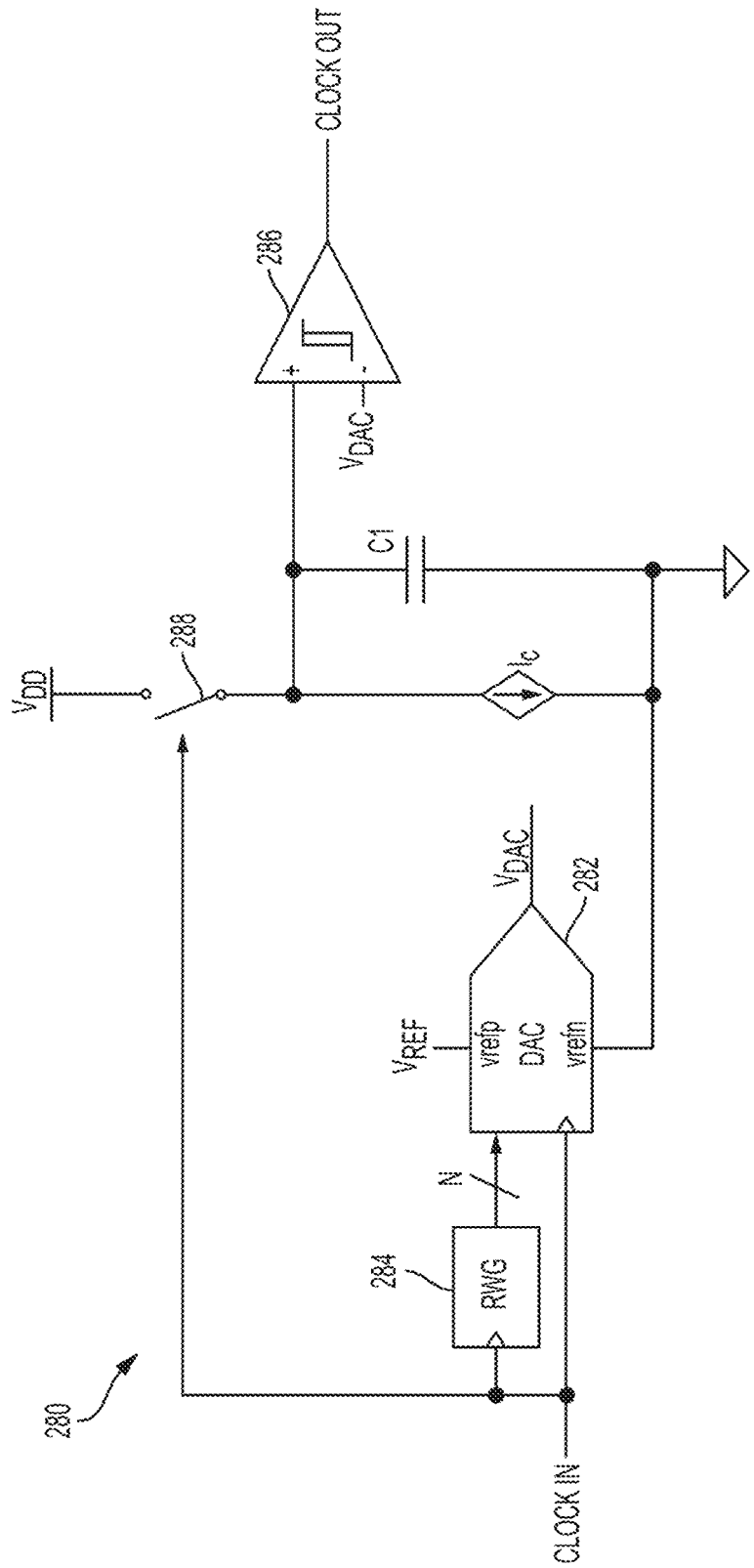
FIG. 2C illustrates a circuit which receives a clock signal and outputs a clock of the same frequency with a random duty cycle, and which may be used to generate a random sampling edge according to embodiments of the present application.

FIG. 2C illustrates a circuit which receives a clock signal and outputs a clock of the same frequency with a random duty cycle. Thus, the circuit of FIG. 2C may be used as a sampling edge randomization circuit, such as sampling edge randomization block 150.

The circuit 280 includes a digital-to-analog converter (DAC) 282, a random word generator 284, a current source $I_C$, a capacitor C1, a comparator 286, and a switch 288. In operation, an input clock signal ("CLOCK IN") (e.g., from system clock 140) is provided to the DAC 282 and random word generator 284. The DAC 282 also receives a reference voltage VREF having positive and negative reference voltages VREFp and VREFn. The DAC 282 outputs a voltage $V_{DAC}$.

The rising edge of the input clock signal CLOCK IN passes through to the output clock signal CLOCK OUT without delay, or with only minimal delay. However, the falling edge of CLOCK IN is delayed by an amount Td given by $$T_d = C1 \frac{V_{dd} - V_{DAC}}{I_C}$$

The output voltage $V_{DAC}$ of DAC 282 changes at each rising edge of CLOCK IN, and sets a new threshold for the comparator. The discharge slope, dV/dt, of capacitor C1 is constant. The randomly varying threshold voltage will therefore create randomly varying falling edge time for CLOCK OUT. The rising edge of the clock charges the capacitor, C1, very rapidly to Vdd which insures that the delay between the rising edge of the input and output clocks is minimal.

Figure 2D:
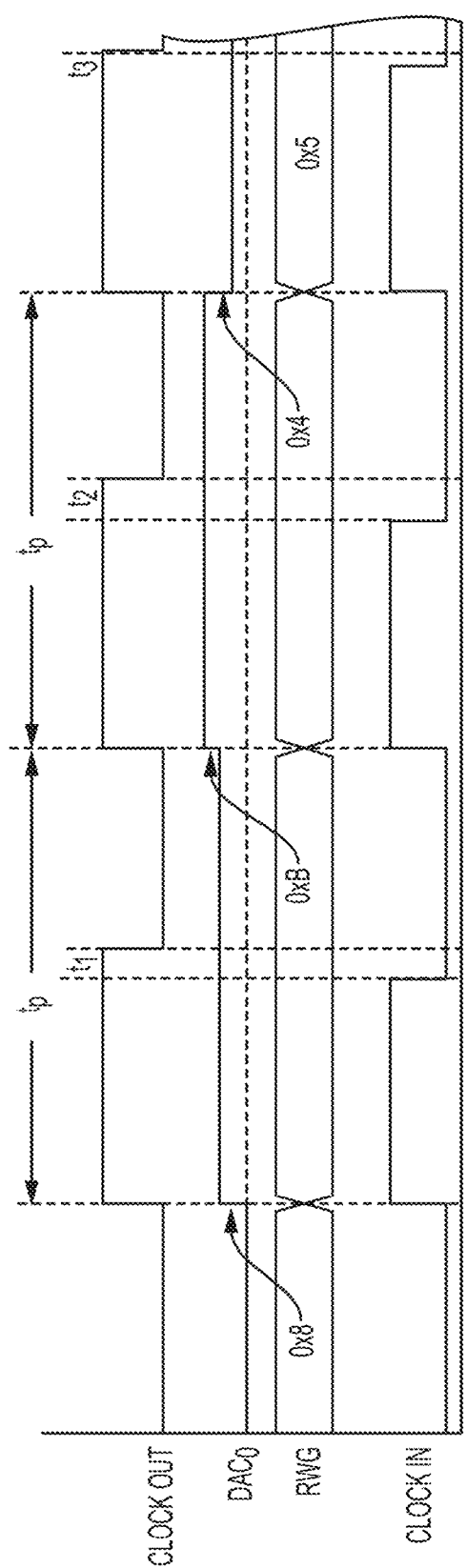
FIG. 2D illustrates a timing diagram for the operation of the circuit of FIG. 2C.

FIG. 2D illustrates a timing diagram for the operation of the circuit 280. It can be seen that the output clock CLOCK OUT has a constant period tp, but that the falling edges, shown at times t1, t2, and t3, occur at different times with respect to the period. Thus, a random sampling edge may be generated from the constant period input clock CLOCK IN.

As an alternative to the circuit 280 of FIG. 2C, a digital multiplexor may be used to receive an input clock signal and output a clock signal having a random edge. The digital multiplexor may pass the input clock while the input clock is high and pass a delayed edge when the input clock is low. This alternative to the circuit 280 of FIG. 2C can reduce the time delay between the rising edges of the input and output clocks to one or two logic gate delays. The period of the output clock may be substantially identical to that of the input clock. This allows "downstream" sampling circuits to use the output of the randomized sampling block without altering their timing to accommodate the randomized sampling.

FIGS. 3A-3C show plots of amplitude versus frequency for three example randomization functions as may be implemented by the clock edge randomization blocks described herein. FIG. 3A illustrates an example of white noise with a flat probability distribution 302. FIG. 3B illustrates an example of band-limited white noise with a probability distribution 304. FIG. 3C illustrates a band-limited white noise with a "M"-shaped amplitude profile 306. In FIGS. 3A-3C, $f_s$ is the modulation clock frequency.

The probability distribution of the randomization function can be shaped sufficiently to reduce the amount of frequency-shifted interference falling within the baseband of the sensor signal. This shaping can be thought of in the frequency domain where the frequency distribution of the randomized clock is weighted away from the mean, with most of the distribution lying outside the clock mean frequency plus baseband frequency of the sensor signal. There is a tradeoff between the shaping of the probability distribution and the amount of interference rejection. FIG. 3D illustrates a plot of amplitude versus frequency showing the effect of the shaped randomized clock on the interference signals at $f_s+f_1$ and $2f_s+f_2$, where $f_s+f_1$ and $2f_s+f_2$ are frequencies for two representative interference signals in the system. The frequency fN is the Nyquist frequency. Without shaping the probability distribution, a band-limited distribution 310 in FIG. 3D may lead to interference contribution appearing in the baseband at frequencies fond $f_2$ after demodulation. With a shaped probability distribution such as the notched "M"-shaped amplitude profile 320, the additional interference-induced contributions can be further rejected in the baseband. Thus, the probability shaping may reduce the additional noise that appears in the baseband due to the smearing of the interference signals over the baseband frequency range.

Figure 4A:
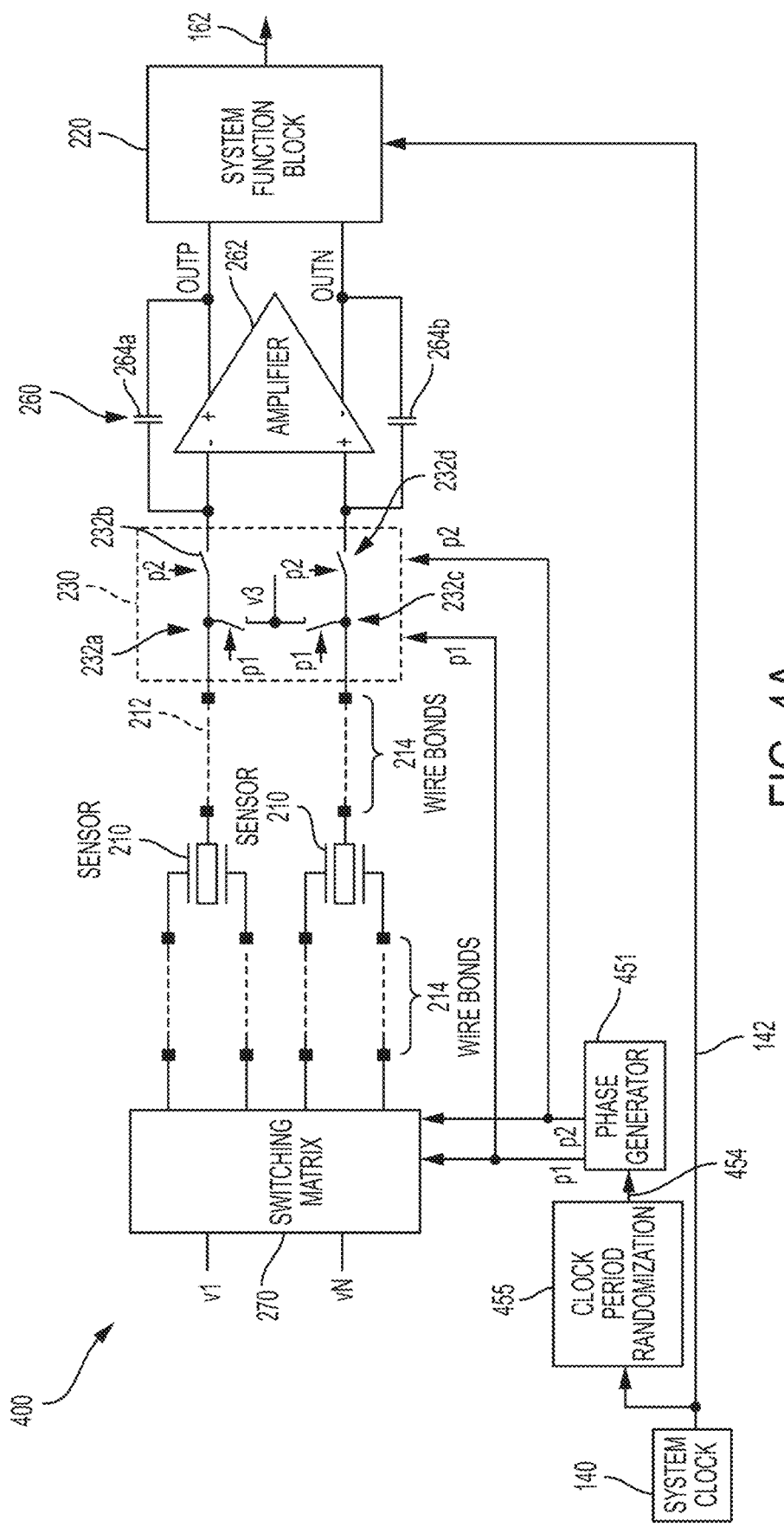
FIG. 4A illustrates an alternative system to that of FIG. 2A, in which the sensor of the system is modulated randomly.

FIG. 4A illustrates an alternative embodiment of the present application in which a sensor output signal is sampled with a sampling signal having a random period, as opposed to simply a random sampling edge. As with the embodiment of FIG. 2A, the embodiment of FIG. 4A may be used to reject interference in sensor signals.

The system 400 of FIG. 4A includes several components previously described in connection with FIG. 2A. The components not previously described include a clock period randomization block 455. The clock period randomization block 455 may be any suitable circuit for receiving a clock signal, such as system clock signal 142, and generating a clock signal having a random period. Examples are described below with respect to FIG. 4C. It should be further appreciated that system 400 lacks the sampling edge randomization block of system 200.

The clock period randomization block 455 is connected to the system clock 140 to receive the system clock signal 142. It generates a randomized clock signal 454 having a random clock period. The randomized clock signal 454 is provided to the phase generator 451 which generates two timing signals, p1 and p2, of different phases for controlling the operation of switching matrix 270 and the demodulation circuit 230. Thus, as opposed to the configuration of FIG. 2A in which four signals with four potentially different phases are generated to control modulation and demodulation of the sensor 210, in system 400 two signals are generated. The function of the clock period randomization block is to alter the period of the modulation/demodulation clock timing in a fashion similar to the example timing sequences shown in FIG. 4B.

Figure 4B:
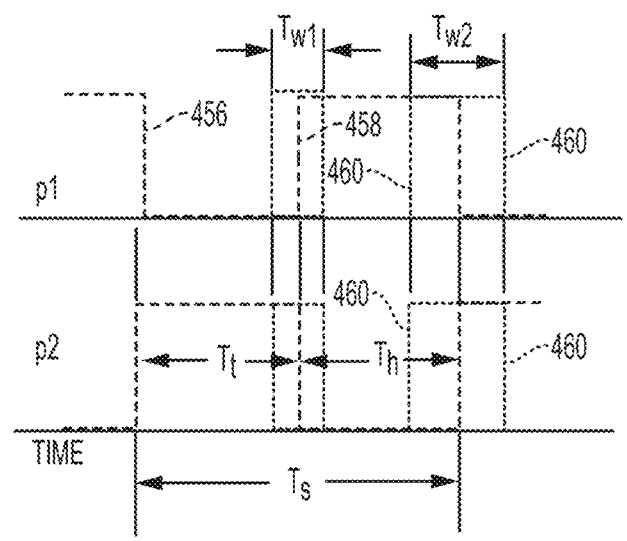
FIG. 4B is a timing diagram illustrating the timing of clock signals used in the system of FIG. 4A.

FIG. 4B illustrates signals p1 and p2 as may be generated in the system 400 of FIG. 4A. As shown by the dashed lines 460 in FIG. 4B, the total time period $T_s$ is variable by an amount labeled $T_{W2}$. Thus, the difference between successive modulation instants 456 representing a falling edge of p1 and a rising edge of p2 is varied by that amount. The demodulation edge 458 represented by a rising edge of p1 and falling edge of p2 is varied by an amount $T_{W1}$ that may be scaled proportionally with the value of $T_{W2}$ based on the duty cycle of the waveform within each $T_s$. Therefore, the method in system 400 varies the modulation and demodulation clocks together so that they both have the same period, which is varied from cycle to cycle. The amount of shift of the clock period represented by $T_{W2}$ is then randomized to randomize interference signals (e.g., electromagnetic interference signals) via both modulation and demodulation, thereby spreading the interference noise power over a wider frequency range. Any of the randomization functions described previously in connection with FIGS. 3A-3D, or any other suitable randomization function, may be employed. The randomization function may be selected to spread the interference noise over frequency ranges outside the sensor signal baseband.

Figure 4C:
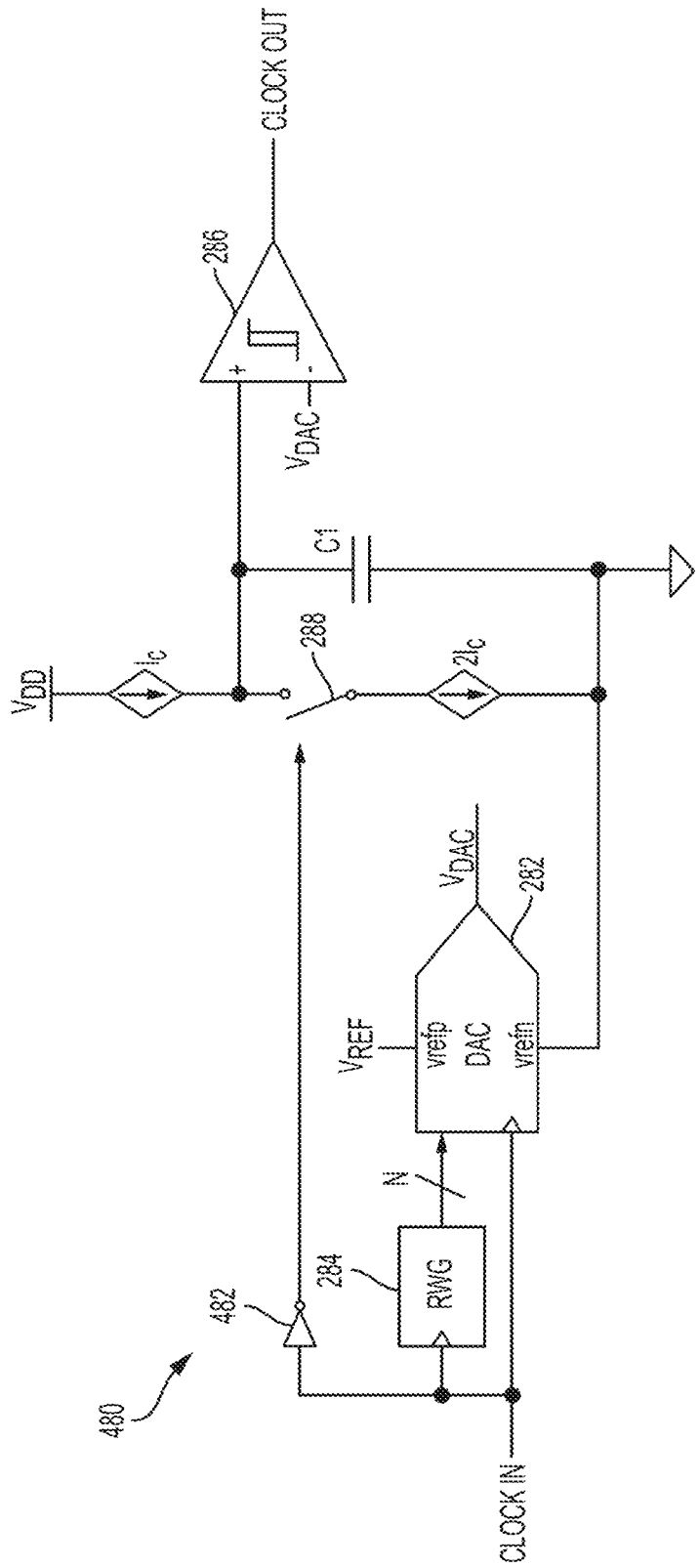
FIG. 4C illustrates an example of a circuit which may be used to generate a random clock period.

FIG. 4C illustrates an example of a circuit which may be used to generate a random clock period, and thus which may be used as the clock period randomization block 455. Those components which are the same as in the circuit 280 of FIG. 2C are given the same reference number and not described in detail again here.

The circuit 480 includes, in addition to those components shown in circuit 280 of FIG. 2C, an inverter 482 and a second current source $2I_C$. In operation, circuit 482 randomizes both the rising and falling edges of the input clock CLOCK IN. This has the effect of randomizing the period (1/frequency) of the output clock CLOCK OUT. Note that even though the currents used to charge and discharge the capacitor C1 are equal, the rise and fall times are inversely correlated (not equal) because the rise time is proportional to $V_{DAC}$ and the fall time is proportional to $(V_{DD}-V_{DAC})$. The rise and fall times are nearly equal when $V_{DAC}$ is near $V_{DD}/2$.

Figure 4D:
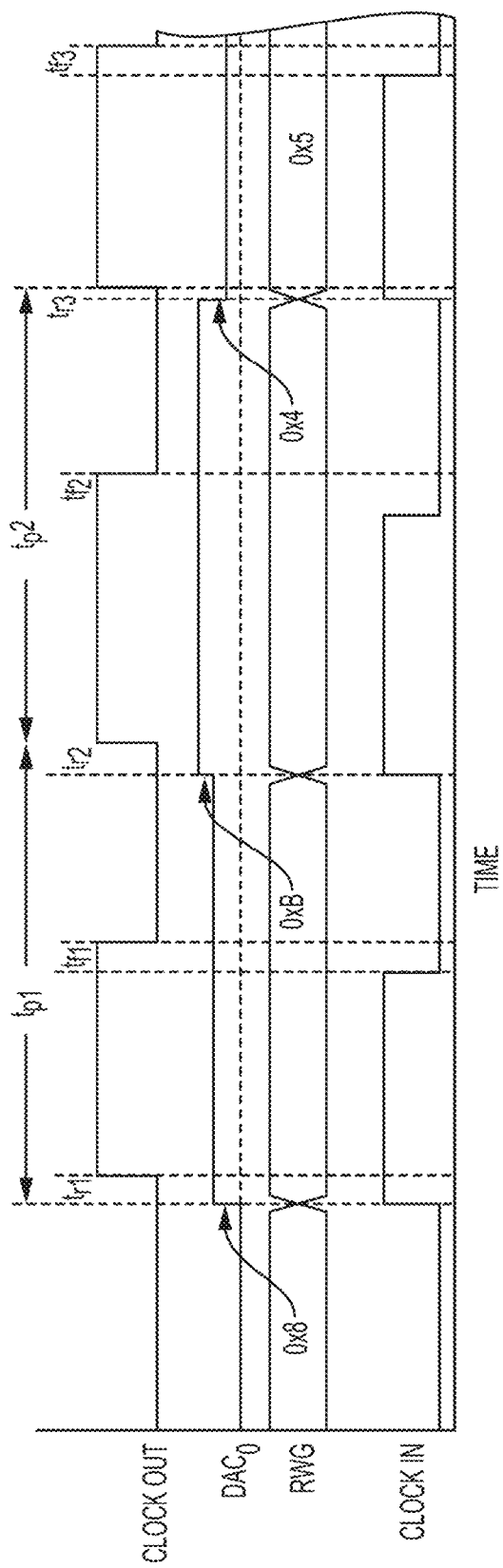
FIG. 4D illustrates a timing diagram for the operation of the circuit of FIG. 4C.

FIG. 4D illustrates a timing diagram of the operation of the circuit 480 of FIG. 4C. The rise times are labeled based on their respective periods as Tr1, Tr2, Tr3 . . . , and likewise the fall times are labeled as Tf1, Tf2, Tf3 . . . It can be seen that the period Tp1 and Tp2 are of unequal duration.

While FIG. 4C illustrates one example of a circuit suitable for generating a clock signal having a random period, it should be appreciated that other circuit configurations and manners of operation may alternatively be used. For example, in some embodiments a linear feedback shift register may be used. Other circuits are also possible.

Compared to the system 200, the system 400 may represent added complexity in that the randomization is not limited to the sampling edge of demodulation circuit 230. Also, by randomizing the clock periods used by switching matrix 270 and demodulation circuit 230, those periods may differ from the period(s) of clock signals used for other components of the system, such as system function block 220. Still, as with the system 200, the system 400 lacks a signal chopper and thus may be simpler in design and less costly than if the system was to include a signal chopper. Both system 200 and system 400 illustrate configurations in which a sensor output signal is provided directly to a demodulation or sampling circuit and then directly to an integrator, without passing through a chopper circuit.

From the foregoing, it should be appreciated that aspects of the present application provide sensor sampling circuits which operate to sample a sensor output signal at a random sampling time. In some embodiments, the random sampling time occurs within a fixed period, such as a fixed period of a clock signal. In other embodiments, the random sampling time occurs within a variable, random period of a clock signal. The sampling circuit may be considered a demodulation circuit in at least some embodiments, and may represent a discrete function block within a larger sensor system. Thus, randomization of the sampling timing may be realized without negatively impacting other function blocks of the system. That is, in at least some embodiments spread spectrum behavior is effectively realized by the system (e.g., systems 200 and 400) without disturbing design of the overall sensor system.

It should further be appreciated that the systems 200 and 400 include demodulation circuits 230 which effectively create half-wave sampled signals, but not all embodiments are necessarily limited in this respect. Such operation may be simpler than operation in which full wave sampling and averaging is performed. Still, the systems described herein may realize significant reduction in sensor signal noise associated with interference. For example, the systems 200 and 400 may exhibit improvements of 20 dB, between 5 dB and 25 dB, or any value within that range, compared to if the sampling randomization described herein was not employed.

Sensors of the types described herein may be packaged. For example, systems 200 and 400 may be packaged using a quad flat no-leads (QFN) package, or other suitable package for mounting to a circuit board and interconnecting with other components. The reduction in interference of the sensor output signal provided by aspects of the present application may obviate the use of electromagnetic shielding devices for the sensor. For example, the systems described herein may be used without a Faraday cage or other shielding component disposed around the sensor, while still providing sufficient low noise operation.

Figure 5:
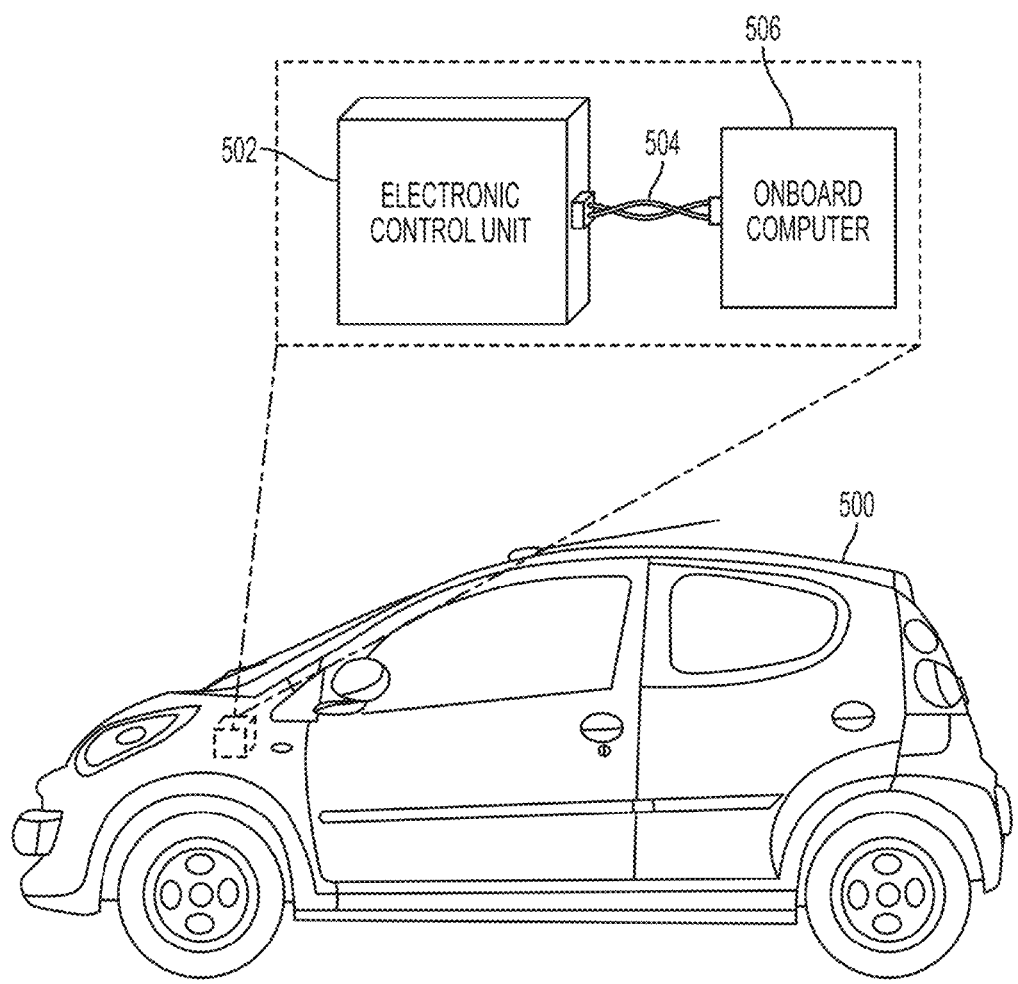
FIG. 5 illustrates an automobile in which may be employed systems of the types described herein, such as those illustrated in FIGS. 1, 2A, and 4A.

Sensor systems of the types described herein may be employed in a variety of settings. One such setting is in automobiles, or other vehicles, such as boats and aircraft. FIG. 5 illustrates an example, in which a sensor system of the types described herein is employed in a car. In the example of FIG. 5, an automobile 500 includes an electronic control unit 502 coupled to an onboard computer 506 of the car by a wired connection 504. The electronic control unit 502 may include system 200 of FIG. 2A, system 400 of FIG. 4A, or another implementation of a system of the types described herein. The electronic control unit 502 may include a package or housing attached to a suitable part of the automobile 500 to sense transmitted forces and accelerations, as an example. The electronic control unit 502 may receive power and control signals from the onboard computer 506, and may supply sensor signals to the onboard computer 506. For example, the sensor signals may be the system output signal 162 of FIG. 2A or 4A. In some embodiments, signals output from the electronic control unit are transmitted via wired connection 504, which in some embodiments is a pair of conductors configured to carry a differential signal representing the sensor measurements (e.g., a twisted pair). In some situations, high frequency electromagnetic interference may be induced on the wired connection 504 or in the electronic control unit 502, either during typical operation of the automobile 500 or during testing (e.g., during a bulk current injection test). Operation of the electronic control unit in the manner described herein in connection with FIG. 1, 2A, or 4A may mitigate or eliminate the impact of such interference. While a wired connection 504 is illustrated, in some embodiments the connection is instead wireless.

While FIG. 5 illustrates deployment of an electronic control unit in an automobile, the electronic control unit may likewise be deployed in other vehicles and coupled to an onboard computer of the vehicle.

The technology described herein may also be used in healthcare, as a further non-limiting example. For example, healthcare monitoring devices, such as wearable devices (e.g., heart rate monitors, motion monitors, respiration monitors) or other components attached to a patient may include an accelerometer or other capacitive sensor. Also, such devices may be subject to electromagnetic interference, for example from other equipment within a hospital room, such as medical imaging equipment, display equipment, or other monitoring equipment, as examples. The systems and techniques described herein may be used to mitigate or eliminate the impact of electromagnetic interference on the desired sensor signals.

It should be appreciated that aspects of the present application are not limited to use with capacitive sensors. While capacitive sensors may be one type of sensor which may realize a particular benefit from the sampling circuits and techniques described herein, other types of sensors may likewise utilize the sampling circuits and techniques described herein. For example, the sensors may be optical or piezoresistive. Other types of sensors may alternatively be used.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An apparatus, comprising:
a capacitive sensor;
a sampling circuit coupled to an output of the capacitive sensor;
a clock edge randomization circuit coupled to an input of the sampling circuit and configured to provide to the sampling circuit a sampling signal with a fixed clock period and a randomly varying duty cycle, wherein the sampling signal comprises:
a plurality of edges of a first type that occur according to the fixed clock period and a plurality of edges of a second type that define the randomly varying duty cycle, and wherein
each edge of the second type occurs within a time window between adjacent edges of the first type.

2. The apparatus of claim 1, further comprising a modulation circuit coupled to an input of the capacitive sensor, the modulation circuit configured to receive a clock signal having the fixed clock period and to provide a modulated signal to the capacitive sensor.

3. The apparatus of claim 2, further comprising a clock circuit configured to generate the clock signal with the fixed clock period, wherein the modulation circuit and the clock edge randomization circuit are coupled to an output of the clock circuit to receive the clock signal.

4. The apparatus of claim 2, further comprising a feedback circuit coupled to an output of the sampling circuit and coupled to an input of the modulation circuit.

5. The apparatus of claim 1, wherein the sampling circuit is configured to produce a half-wave sampled signal.

6. The apparatus of claim 1, wherein the apparatus lacks a signal chopper coupled to the capacitive sensor.

7. The apparatus of claim 1, wherein the capacitive sensor, sampling circuit, and clock edge randomization circuit are part of an electronic control unit, the apparatus further comprising an onboard vehicle computer and a wire coupling the electronic control unit to the onboard vehicle computer.

8. An apparatus, comprising:
a capacitive sensor; and
means for sampling an output signal of the capacitive sensor based on a sampling signal with a fixed clock period and a randomly varying duty cycle, wherein the sampling signal comprises a plurality of edges of a first type that occur according to the fixed clock period and a plurality of edges of a second type that define the randomly varying duty cycle, and wherein each edge of the second type occurs within a time window between adjacent edges of the first type.

9. The apparatus of claim 8, further comprising a modulation circuit coupled to an input of the capacitive sensor, the modulation circuit configured to receive a clock signal having the fixed clock period and to provide a modulated signal to the capacitive sensor.

10. The apparatus of claim 9, further comprising a feedback circuit coupled between an output of the means for sampling an output signal of the capacitive sensor based on a sampling signal and an input of the modulation circuit.

11. The apparatus of claim 9, further comprising a clock circuit configured to generate the clock signal with the fixed clock period, wherein the means for sampling the output signal of the capacitive sensor based on a sampling signal comprises means for generating from the clock signal with the fixed clock period the sampling signal with the fixed clock period and a randomly varying duty cycle.

12. The apparatus of claim 8, wherein the apparatus lacks a signal chopper coupled to the capacitive sensor.

13. The apparatus of claim 8, wherein the capacitive sensor and means for sampling an output signal of the capacitive sensor based on a sampling signal are part of an electronic control unit, the apparatus further comprising an onboard vehicle computer and a wire coupling the electronic control unit to the onboard vehicle computer.

14. A method, comprising:
generating a sensor output signal from a capacitive sensor;
generating a sampling signal with a fixed clock period and a randomly varying duty cycle, wherein the sampling signal comprises a plurality of edges of a first type that occur according to the fixed clock period and a plurality of edges of a second type that define the randomly varying duty cycle, wherein each edge of the second type occurs within a time window between adjacent edges of the first type; and
sampling the sensor output signal with the sampling signal.

15. The method of claim 14, further comprising modulating an input signal of the capacitive sensor using a clock signal having the fixed clock period.

16. The method of claim 15, further comprising generating the clock signal having the fixed clock period, wherein generating the sampling signal comprises generating the sampling signal from the clock signal having the fixed clock period.

17. The method of claim 15, further comprising providing a feedback signal to a modulation circuit which performs the modulating of the input signal.

18. The method of claim 14, wherein sampling the sensor output signal with the sampling signal comprises generating a half-wave sampled signal.

19. The method of claim 14, wherein sampling the sensor output signal comprises sampling the sensor output signal without use of a chopper circuit.

20. The method of claim 14, wherein sampling the sensor output signal comprises generating a sampled sensor signal, and wherein the method further comprises providing the sampled sensor signal to an onboard computer of a vehicle.

* * * * *